(12) United States Patent
Haq et al.

(10) Patent No.: US 11,527,711 B2
(45) Date of Patent: Dec. 13, 2022

(54) MTJ DEVICE PERFORMANCE BY CONTROLLING DEVICE SHAPE

(71) Applicant: Taiwan Semiconductor Manufacturing Company, Ltd., Hsinchu (TW)

(72) Inventors: Jesmin Haq, Milpitas, CA (US); Tom Zhong, Saratoga, CA (US); Zhongjian Teng, Santa Clara, CA (US); Vinh Lam, Dublin, CA (US); Yi Yang, Fremont, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/195,317

(22) Filed: Mar. 8, 2021

(65) Prior Publication Data
US 2021/0193915 A1   Jun. 24, 2021

Related U.S. Application Data

(63) Continuation of application No. 15/810,494, filed on Nov. 13, 2017, now Pat. No. 10,944,049.

(51) Int. Cl.
*H01L 43/12* (2006.01)
*H01F 10/06* (2006.01)
(Continued)

(52) U.S. Cl.
CPC ............. *H01L 43/12* (2013.01); *H01F 10/06* (2013.01); *H01F 10/16* (2013.01); *H01L 43/02* (2013.01); *H01L 43/08* (2013.01); *H01L 43/10* (2013.01)

(58) Field of Classification Search
CPC ......... H01L 43/12; H01L 43/02; H01L 43/08; H01L 43/10; H01F 10/06; H01F 10/16
See application file for complete search history.

(56) References Cited

U.S. PATENT DOCUMENTS 7,998,758 B2   8/2011   Ahn et al.
9,305,928 B2   4/2016   Kim et al.
(Continued)

FOREIGN PATENT DOCUMENTS

DE   102015112860 A1   1/2017

OTHER PUBLICATIONS

Songsiririthigul et al., "Strain induced defects in Si1-xGex alloy layers formed by solid phase epitaxial growth of 40 KeV Ge+ion implanted silicon", Nuclear Instruments and Methods in Physics Research B124 (1997) 55-65.
(Continued)

*Primary Examiner* — Sitaramarao S Yechuri
(74) *Attorney, Agent, or Firm* — Haynes and Boone, LLP (57) ABSTRACT

A layered thin film device, such as a MTJ (Magnetic Tunnel Junction) device can be customized in shape by sequentially forming its successive layers over a symmetrically curved electrode. By initially shaping the electrode to have a concave or convex surface, the sequentially formed layers conform to that shape and acquire it and are subject to stresses that cause various crystal defects to migrate away from the axis of symmetry, leaving the region immediately surrounding the axis of symmetry relatively defect free. The resulting stack can then be patterned to leave only the region that is relatively defect free.

20 Claims, 6 Drawing Sheets

(51) Int. Cl.
*H01F 10/16* (2006.01)
*H01L 43/02* (2006.01)
*H01L 43/08* (2006.01)
*H01L 43/10* (2006.01)

(56) References Cited

U.S. PATENT DOCUMENTS

| | | |
|---|---|---|
| 2002/0155627 A1 | 10/2002 | Okazawa et al. |
| 2008/0099785 A1* | 5/2008 | Bai .................... C30B 25/183 |
| | | 257/190 |
| 2013/0015540 A1 | 1/2013 | Choi |
| 2013/0026585 A1 | 1/2013 | Sung et al. |
| 2014/0063924 A1 | 3/2014 | Nakai et al. |
| 2015/0311434 A1 | 10/2015 | Loong et al. |
| 2016/0064648 A1 | 3/2016 | Tsubata et al. |
| 2016/0099402 A1 | 4/2016 | Mizukami et al. |
| 2018/0268888 A1* | 9/2018 | Ohsawa ................ G11C 11/161 |

OTHER PUBLICATIONS

Li Ming Loong et al., "Strain-enhanced tunneling magnetoresistance in MgO magnetic tunnel junctions", Scientific Reports 4, Article No. 6505 (2014), doi:10.1038/srep06505, Sep. 30, 2014, pp. 1-24.
Zhang Hao et al., "Tuning the magnetic anisotropy of CoFeB grown on flexible substrates", Chinese Physics B, vol. 24, No. 7, May 29, 2015, Chinese Physical Society and IOP Publishing Ltd, 10pgs.
German Patent and Trademark Office, Office action dated Dec. 20, 2021, in German patent file reference 112018004449, includes English language translation.

* cited by examiner

MTJ DEVICE PERFORMANCE BY CONTROLLING DEVICE SHAPE

PRIORITY DATA

The present application is a continuation application of U.S. patent application Ser. No. 15/810,494, filed Nov. 13, 2017, which is hereby incorporated by reference in its entirety.

BACKGROUND

1. Technical Field

This disclosure relates generally to magnetic memory devices, specifically to the effect of the shape of a device on its performance.

2. Description of the Related Art

The crystalline property of the structure of a magnetic memory device, specifically that of the ferromagnetic/MgO tunneling barrier interface of a MTJ (magnetic tunneling junction) device, plays a very critical role in the device performance. In particular, the strain in the structure can significantly alter the properties of the device, for reasons to be discussed below.

Magnetic memory devices comprise a stack of layers in which two ferromagnetic layers, typically referred to as a reference layer and a free layer, are separated by a thin, non-magnetic dielectric layer, called a barrier layer. In the classical physics regime, a current of electrons going from one ferromagnetic layer to the other would be unable to pass through the barrier layer, which is non-conducting; but according to quantum mechanics, electrons can "tunnel" through the barrier layer if the right conditions exist in terms of the spin of the tunneling electrons and the magnetization directions of the two ferromagnetic layers on either side of the barrier. The conditions necessary for the electrons to successfully tunnel also depend on the quality of the interfaces between the barrier layer and the ferromagnetic layers. Imperfections in the interfaces make it difficult to achieve high TMR (Tunneling Magneto Resistance) values, which measure the ability of the electrons to successfully tunnel when the proper magnetization conditions are met. Such imperfections result from lattice mismatches between the ferromagnetic layers and the non-magnetic barrier layer and from defects that occur during crystal growth of materials. These undesirable qualities are associated with strain which, in turn, causes reduction in the TMR values, as has been documented, for example, in "Strain-enhanced tunneling magnetoresistance in MgO magnetic tunnel junctions," by Li Ming Long et al., Scientific Reports 4, Article number 6505 (2014) and also "Tuning the magnetic anisotropy of CoFeB grown on flexible substrates" by Zhang Hao et al. in Chinese Physics B, Volume 24, Number 7-077501 (2015)

Given the fact that the shape of a crystalline layer affects the stresses and strains in the layer which, in turn, affects the growth of defects in that layer, controlling layer shape should permit a corresponding control of and even a purposeful manipulation of the stresses in an MTJ film stack. Therefore, such a shape controlling process should enable improvements in device performance, for example, improving the TMR and the coercivity of the device. More specifically, the new shape of a device, if properly designed and produced, can be expected to reduce the interface defect concentration and improve interface lattice epitaxy, all of which will improve device performance.

Attempts to influence device performance by shape control are known in the prior art, for example, Ahn et al. (U.S. Pat. No. 7,998,758) and Kim et al. (U.S. Pat. No. 9,305,928). However these attempts do not use the same methods or produce the same effects as will be described herein.

SUMMARY

A first object of the present disclosure is to provide a method of improving the performance of a layered MTJ device by controlling its shape.

A second object of the present disclosure is to provide such a method that reduces interfacial defect concentrations and lattice mismatches and improves lattice epitaxy, thereby creating a measurable improvement in TMR.

A third object of the present disclosure is to provide such a method that allows controlling and manipulating the shape of a layered device during its fabrication, in effect customizing its shape.

A fourth object of the present disclosure is to control the stresses in a TMJ layered film stack or similar device structure by controlling its shape so that the stresses thereby cause crystal defects to migrate towards regions of the structure that can be subsequently removed.

These objects will be achieved through the design and fabrication of a patterned, layered MTJ device during which its shape is controlled in such a manner that crystal defects such as vacancies, pinholes and dislocations within the stack are moved to an undesirable weak zone which can subsequently be removed. The relatively defect-free remaining portion of the device will have a higher coercivity and improved TMR values. The new device shape will, therefore, reduce the interface defect concentration and improve the interface lattice epitaxy, both results leading to improvement of device performance as, for example, measured by the improved TMR values.

DETAILED DESCRIPTION

Figure 1:
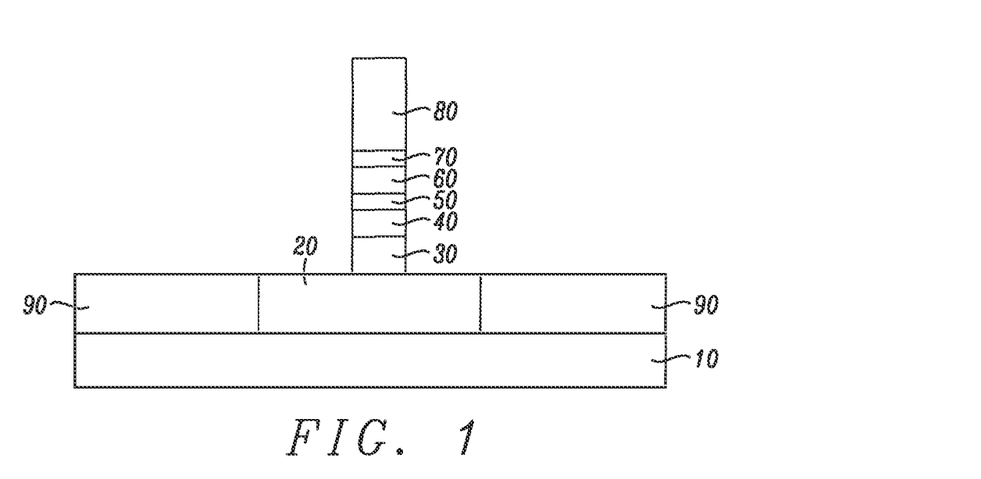
FIG. 1 is a schematic illustration of a prior art MTJ device.

Referring first to FIG. 1, there is shown a standard patterned MTJ (Magnetic Tunneling Junction) layered device such as is commonly used in a random access memory (RAM) array. Although a specific substrate is not necessary to define the device, for specificity we will consider the device to be formed on a functional substrate, such as a CMOS substrate, that may already include circuitry and conducting vias to access various elements of the devices in a RAM array.

The device is formed by first providing a CMOS substrate 10 on which to form it. A blanket bottom electrode (BE) 20 is deposited on the CMOS substrate so that it properly contacts the vias in that substrate. There is then deposited on top of the bottom electrode 20, in succession, a series of horizontal layers that will comprise the MTJ stack. Those layers include, a seed layer 30, a pinned magnetic layer 40, a tunnel barrier layer 50, a free magnetic layer 60 and capping layer 70. A hard mask 80 is deposited on the capping layer. The hard mask is then patterned by a standard photolithographic process (not shown) and the film stack is then patterned using the patterned hard mask as a guide. Note that the bottom electrode is also shown as patterned and it is surrounded laterally by dielectric fill material 90.

Figure 8:
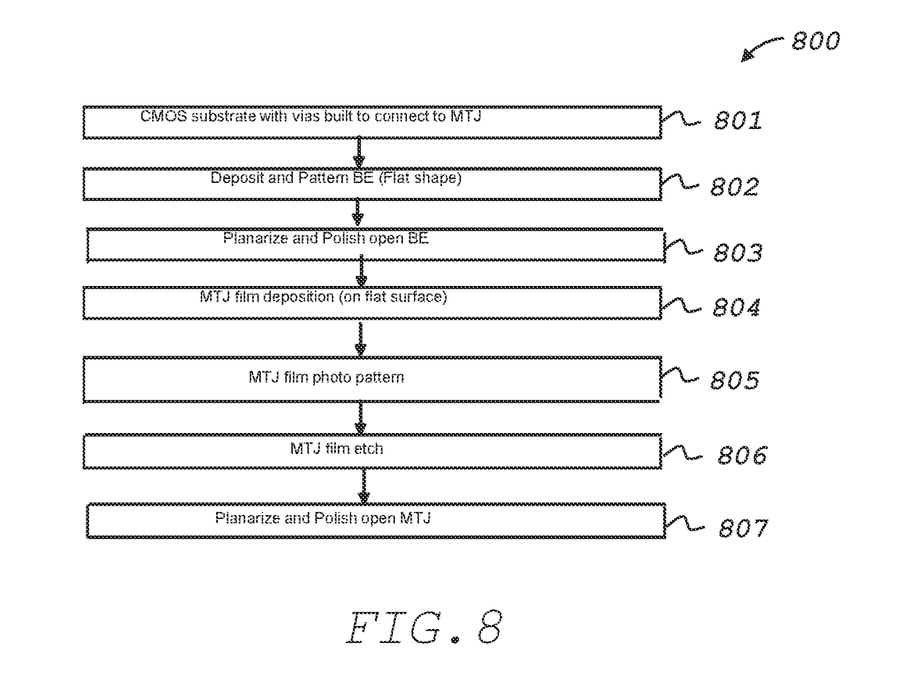
FIG. 8 is a process flow diagram showing the sequence of steps that lead to the structure illustrated in FIG. 1.

The process steps (801-807) leading to the formation of the typical prior art MTJ as shown in FIG. 1 and described in detail above, can be summarized in the flow diagram 800 shown in FIG. 8.

Figure 2:
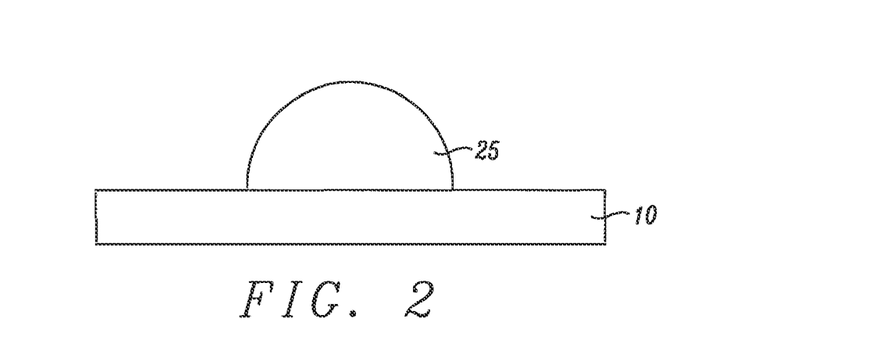
FIG. 2 schematically shows a dome-shaped bottom electrode for the device in FIG. 1 in accord with the method of the present disclosure.

We will now describe the method of the present disclosure as illustrated with reference to FIG. 2-FIG. 4. We note at the outset that the method will be described with reference to an MTJ device, but it is applicable to any layered, crystalline structure that can be expected to accumulate various types of defects as it is grown.

Like the prior-art method described by the process flow chart in FIG. 1, above, the method of the present disclosure also begins with a CMOS substrate 10 (although other substrates are also possible) and, on this substrate a bottom electrode layer 20 formed of conducting material is deposited. However, the present method deviates from the prior-art method above by patterning and etching the electrode to form a "dome" (i.e., a symmetrical convex) shape 25, as is shown in FIG. 2. Note that the "dome" or convex shape, is here axially (about a horizontal axis) symmetric, so it is more correctly a cylinder (or a semi-circular cylinder if the convex shape has a semi-circular cross-section).

There are several methods by which the electrode can be formed with a surface having a convex, cylindrical shape, or indeed, by which an electrode can be formed with various surface shapes other than a convex shape, such as a concave shape to be discussed below. For example, an initial etch can be performed on a layer of electrode material to create a solid rectangular prism and then a partial etch (or series of partial etches) can be performed that successively removes corners of the electrode to give it the rounded surface shape. Alternatively, a sputter etch can be performed to produce a rounded surface shape. To form a concave surface, isotropic physical etching can be performed.

Figure 3:
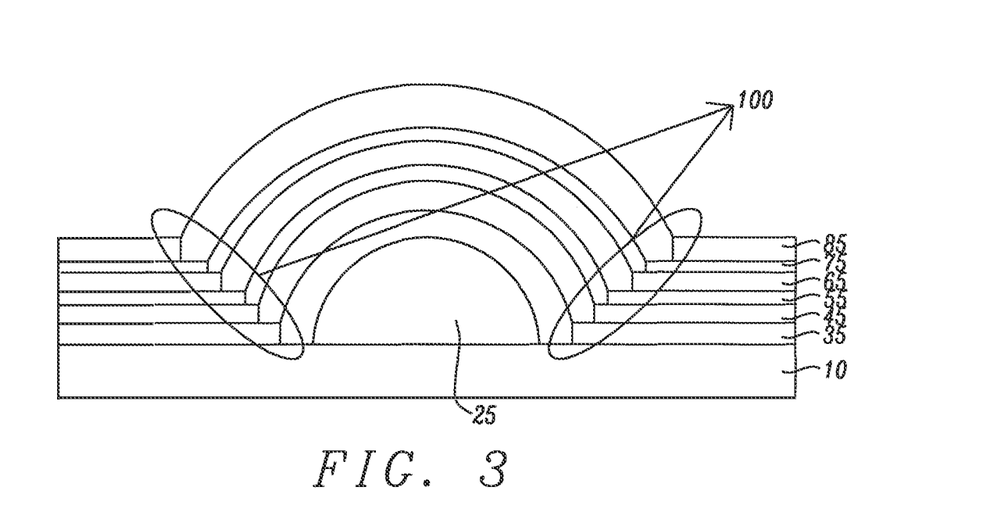
FIG. 3 schematically shows the effects on the formation of a layered MTJ stack when the stack is formed over the dome-shaped electrode of FIG. 2.

Referring next to schematic FIG. 3, there is shown the result of a sequential deposition process in which there is first deposited on the convex cylindrical electrode 25, a seed layer 35, which is followed by a pinned layer 45, a barrier layer 55, a free layer 65, a capping layer 75 and a hard mask layer 85. These layers will all conform to the shape of the electrode, by each layer conforming, in sequence, to the shaped layers beneath it. For definiteness we note that the above process steps can be applied to a typical MTJ structure having a seed layer of Ta, Ru, W or NiCr with a thickness range of between approximately 50-500 A (angstroms), ferromagnetic layers for pinned and free layers formed of CoFeB with a thickness range between approximately 10-100 A, a tunneling barrier layer of AlOx or MgO of thickness between approximately 5-50 A and a capping layer of Ta, W or Mg with a thickness range between approximately 10-100 A. The convex electrode can have a thickness of between approximately 100-1000 nm and have a width between approximately 50-500 nm.

Due to the underlying convex shape, as successive layers are formed and develop their crystalline structure, the inevitable defects produced by the crystal growth mechanism, such as pinholes, vacancies and dislocations, will move away (migrate) from the top of the convexity of each successively formed layer and accumulate at the corners where the underlying curved shape of the electrode becomes a horizontal layer. This is what is called the "weak" region of the structure (see the region surrounded by an ellipse 90).

The region of the stack containing a small region to either side of the peak of the convex structure will be relatively defect free. By controlling the slope (curvature) of the convexity, the film strain can be manipulated, and the lattice mismatch and interfacial defect concentration can be reduced within a desired region symmetrically disposed to either side of the peak of the convex structure. Note that the width of the convexity that can be considered relatively defect free can cover most of the total width of the curved region with exception of the weak regions 90 at the corners. In most cases, more than half of the width of the convexity, centered about its highest point can be considered defect free. For example, an electrode having a base width of 200 nm will produce a defect free device shape of at least 100 nm.

Figure 4:
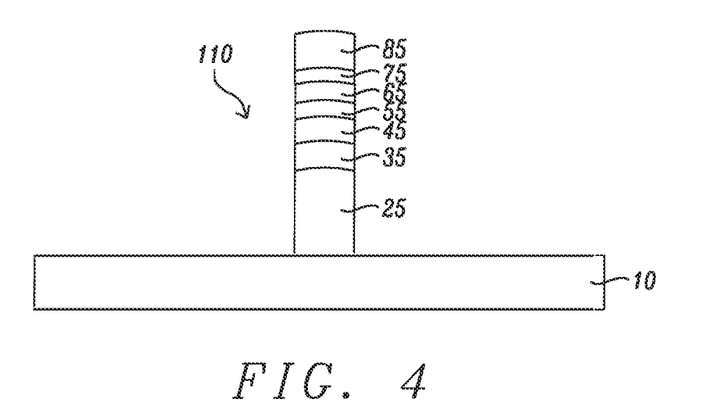
FIG. 4 is a schematic illustration showing the effects of patterning the stack of FIG. 3, so that laterally disposed regions of the stack containing defects resulting from its formation over a dome-shaped electrode are eliminated.
Figure 9:
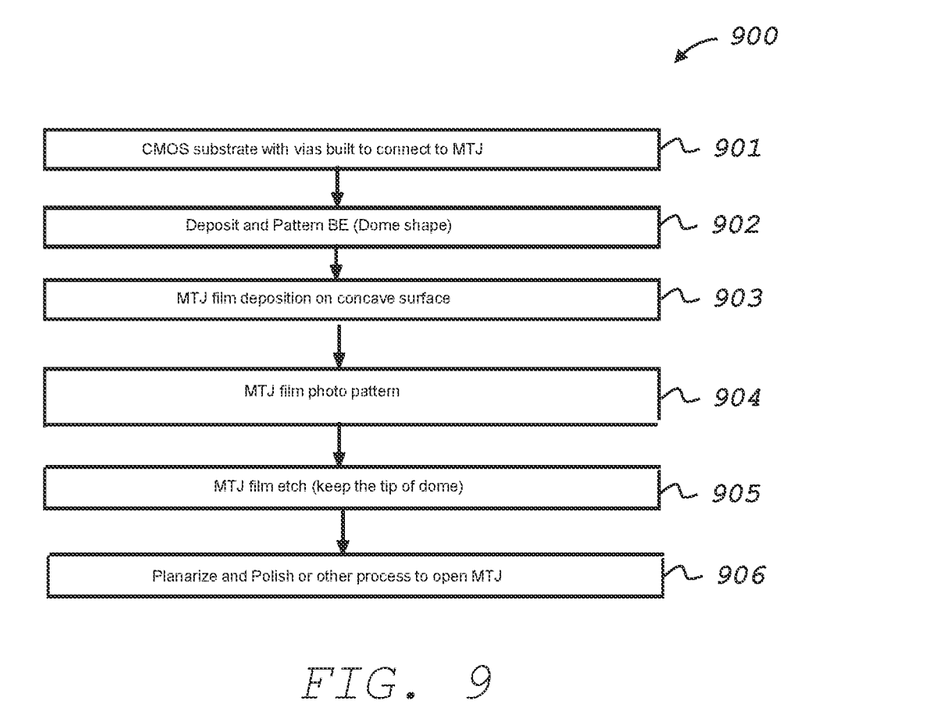
FIG. 9 is a process flow diagram showing the sequence of steps that lead to the structure illustrated in FIG. 4.

After the convex structure is patterned to produce the vertical stack, which is actually a cylindrical slice, as shown in schematic FIG. 4, the gaps to either side 110 are filled with a gap-filling dielectric material (not shown) and the upper surfaces of the stack and its surrounding dielectric are planarized and polished to remove the mask layer in preparation for further process integration. Note that FIG. 9 is a process flow 900 that briefly describes the sequence of steps (901-906) that lead to the structure in FIG. 4.

Figure 5:
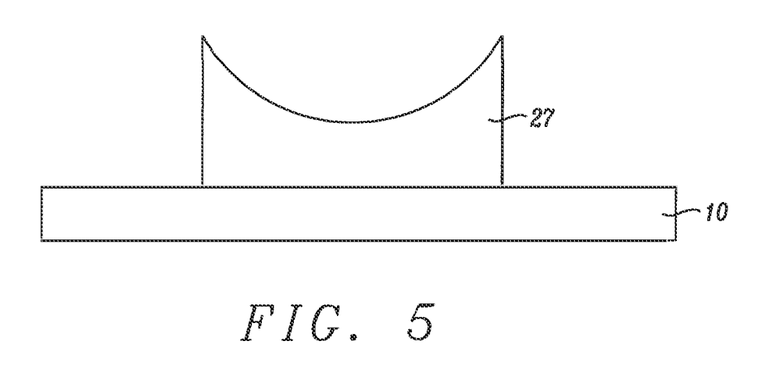
FIG. 5 is a schematic illustration of an alternative electrode which is concave rather than convex as is the dome-shaped electrode.

Referring next to schematic FIG. 5, there is shown an alternative embodiment of the present process where the bottom electrode 27 is shaped to have a concave upper surface and is otherwise axially symmetric.

Figure 6:
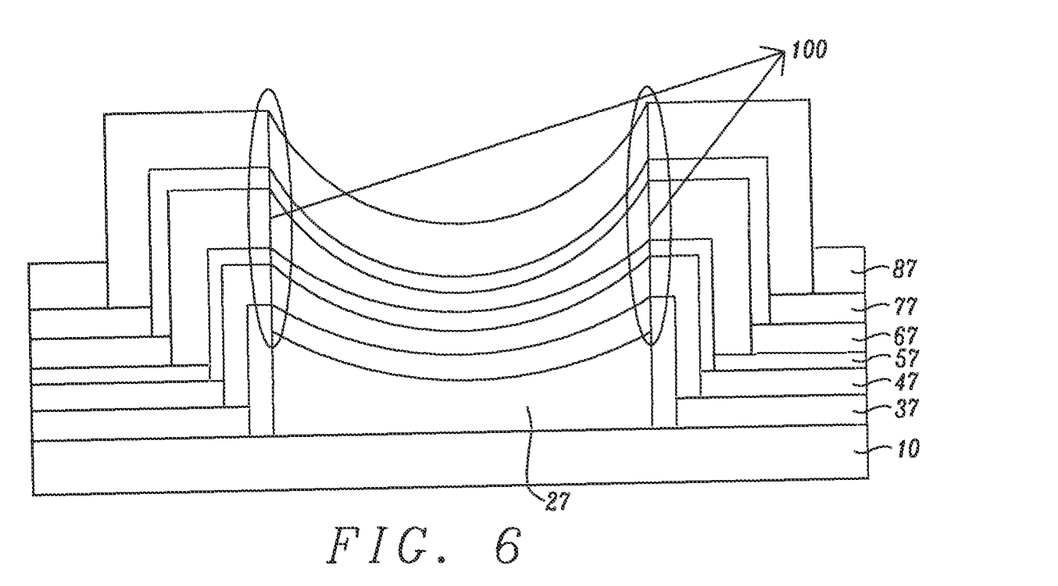
FIG. 6 is a schematic illustration, analogous to that of FIG. 3, but now showing the effects of forming a MTJ stack over the concave electrode of FIG. 5.

Referring next to FIG. 6, there is shown that the film stack of the MTJ (or any layered crystalline construction) can be deposited over the concave bottom electrode 27 in the same manner as it was deposited over the previously described convex electrode. FIG. 6, shows schematically the result of a sequential deposition process in which there is first deposited on the concave electrode 27 a seed layer 37, which is followed by a pinned layer 47, a barrier layer 57, a free layer 67, a capping layer 77 and a hard mask layer 87. These layers will all try to conform to the concave shape of the electrode, by each layer conforming, in sequence, to the concave-shaped layers beneath it. Note that the material layers can be formed of the same materials and dimensions as described above for the convex structure.

Due to the underlying concave shape, as successive layers are formed and develop their crystalline structure, the inevitable defects produced by the crystal growth mechanism, such as pinholes, vacancies and dislocations, will move away (migrate) from the bottom point of the concavity of each layer and accumulate at the upper corners where the concavity, discontinuously, merges with the horizontal layer of the substrate 10. The region of the stack containing a small region to either side of the concave minimum will be relatively defect free. This region surrounding the discontinuity, called a "weak" region, is shown enclosed in an elliptical region 100. It is at this weak region that defects will accumulate. By controlling the shape of the electrode 27 the film strain in the sequentially deposited layers can be manipulated, and the lattice mismatch and interfacial defect concentration can be reduced in a specific region.

Figure 7:
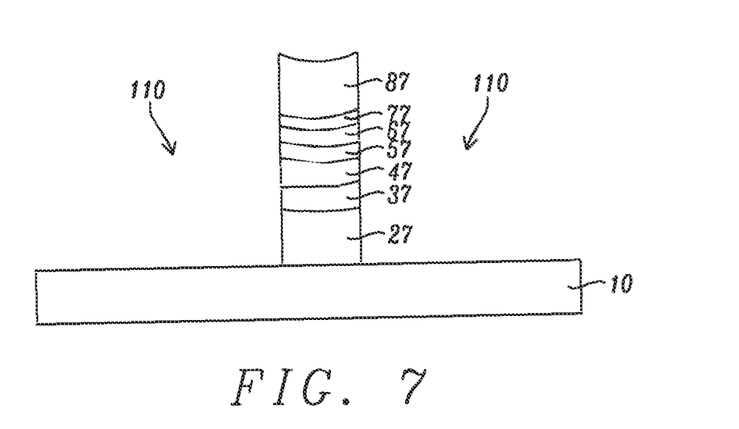
FIG. 7 is a schematic illustration showing the effects of patterning the stack of FIG. 6, so that laterally disposed regions of the stack containing defects resulting from its formation over a concave electrode are eliminated.

After the concave-shaped structure is patterned to produce the vertical stack that now contains the defect-free bottom of the concavity, as shown in schematic FIG. 7, the gaps to either side 110 are filled with a gap-filling dielectric material and the upper surfaces of the stack and its surrounding dielectric are planarized and polished in preparation for further process integration (not shown).

Figure 10:
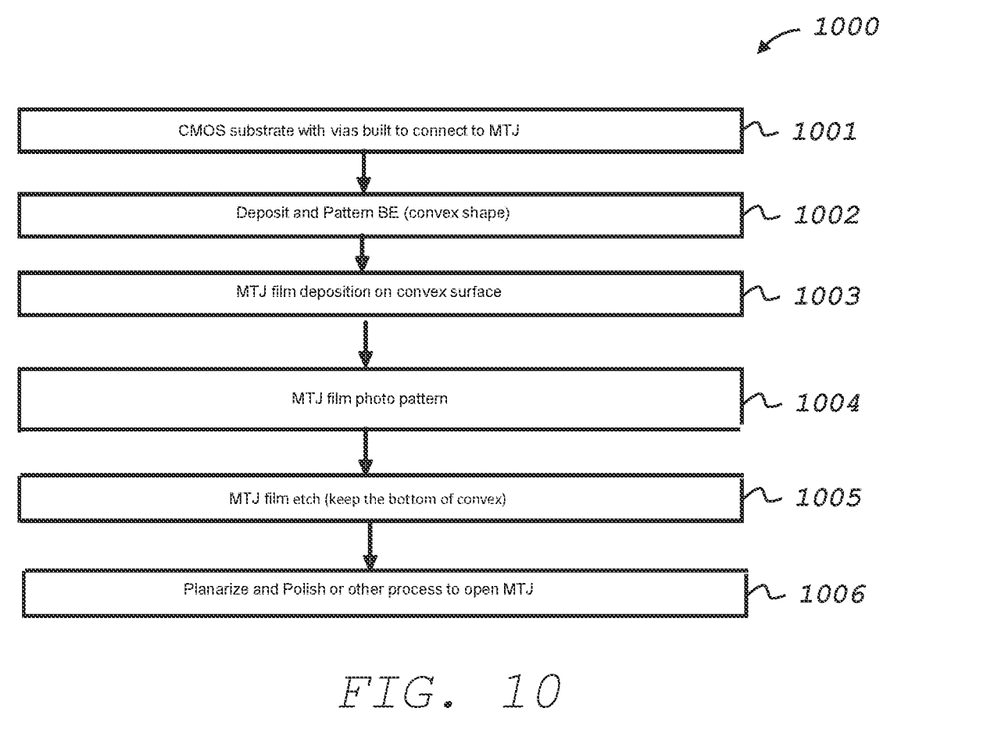
FIG. 10 is a process flow diagram showing the sequence of steps that lead to the structure illustrated in FIG. 7.

Note that FIG. 10 is a process flow 1000 that briefly describes the sequence of steps (1001-1006) that lead to the structure in FIG. 7.

As is finally understood by a person skilled in the art, the detailed description given above is illustrative of the present disclosure rather than limiting of the present disclosure. Revisions and modifications may be made to methods, materials, structures and dimensions employed in forming and providing a layered crystalline magnetic device such as an MTJ device, whose layer strain is controlled during layer formation to reduce crystal defects and thereby to improve device performance, while still forming and providing such a structure and its method of formation in accord with the spirit and scope of the present invention as defined by the appended claims.

What is claimed is:

1. A method comprising:
   forming an electrode layer having a curved top surface on a top surface of a substrate;
   forming a stack of magnetic tunneling junction (MTJ) layers on the curved top surface of the electrode layer, wherein each layer in the stack of MTJ layers acquires a respective curved top surface from the forming of the stack of MTJ layers on the curved top surface of the electrode layer, and wherein defects associated with crystalline growth for each layer of the stack of MTJ layers migrate to outer portions of each layer during the forming of each layer of the stack of MTJ layers, wherein each respective curved top surface for each layer in the stack of MTJ layers spans a different distance over the substrate after the forming of the stack of MTJ layers on the curved top surface of the electrode layer, wherein the distance for each respective curved top surface is measured along a first direction that is substantially parallel to the top surface of the substrate; and
   removing the outer portions of each layer that contain defects associated with crystalline growth for each layer such that a remaining portion of each layer of the stack of MTJ layers is relatively free of defects associated with crystalline growth.

2. The method of claim 1, wherein the defects are selected from the group consisting of vacancies, pinholes and dislocations.

3. The method of claim 1, wherein the curved top surface of the electrode layer has a convex shaped cross-sectional profile.

4. The method of claim 1, wherein the curved top surface of the electrode layer has a concave shaped cross-sectional profile.

5. The method of claim 1, wherein the stack of MTJ layers includes a pinned layer, a tunneling junction layer and a free layer.

6. The method of claim 1, wherein the remaining portions of each layer of the stack of MTJ layers has the same width.

7. The method of claim 1, wherein the forming of the electrode layer having the curved top surface includes forming the electrode layer on a substrate, and
   wherein a portion of the substrate is exposed by the removing of the outer portions of each layer that contain defects.

8. A method comprising:
   forming a conductive layer having an axially symmetric curved top surface on a top surface of a substrate; and
   forming a stack of magnetic tunneling junction (MTJ) layers on the curved top surface of the conductive layer, wherein the forming of the stack of the MTJ layers includes inducing strain in at least one layer of the stack of MTJ layers to cause defects in the at least one layer to migrate to an outer portion of the at least one layer, wherein the at least one layer includes a middle portion having a curved top surface and the outer portion has a flat top surface that is substantially parallel to the top surface of the substrate after the forming of the stack of the MTJ layers.

9. The method of claim 8, further comprising removing the outer portion of the at least one layer after inducing strain in the at least one layer of the stack of MTJ layers.

10. The method of claim 9, wherein a remaining portion of each layer from the stack of MTJ layers remains disposed over the substrate after the removing of the outer portion of the at least one layer, and
    wherein the remaining portion of each layer is relatively free of defects.

11. The method of claim 8, wherein the inducing of strain in the at least one layer of the stack of MTJ layers includes inducing strain in each layer of the stack of MTJ layers to cause defects in each layer to migrate to a respective outer portion of each layer.

12. The method of claim 8, wherein the substrate includes a flat top surface, and
    wherein the forming of the conductive layer having the axially symmetric curved top surface on the substrate includes forming the conductive layer directly on the flat top surface of the substrate.

13. The method of claim 8, wherein the axially symmetric curved top surface has a convex shaped cross-sectional profile.

14. The method of claim 8, wherein the axially symmetric curved top surface has a concave shaped cross-sectional profile.

15. The method of claim 8, wherein the stack of MTJ layers includes:
    a seed layer formed of a material selected from the group consisting of Ta, Ru, W and NiCr,
    a free layer formed of CoFeB;
    a pinned layer formed of CoFeB;
    a tunneling barrier layer that includes an oxide material; and
    a capping layer formed of a material selected from the group consisting of Ta, W and Mg.

16. The method of claim 8, wherein the defects are selected from the group consisting of vacancies, pinholes and dislocations.

17. The method of claim 8, wherein the conductive layer includes an electrode layer.

18. A method comprising:
    forming a stack of magnetic tunneling junction (MTJ) layers over a top surface of a substrate, wherein the forming of the stack of the MTJ layers includes inducing strain in at least one layer of the stack of MTJ layers to cause defects in the at least one layer to migrate to an outer portion of the at least one layer, wherein the at least one layer includes a middle portion having a curved top surface and the outer portion has a flat top surface that is substantially parallel to the top surface of the substrate after the forming of the stack of the MTJ layers; and
    removing the outer portion of the at least one layer after inducing strain in the at least one layer of the stack of MTJ layers.

19. The method of claim 18, further comprising forming a bottom electrode over the substrate having a curved top surface, and
    wherein the forming of the stack of MTJ layers over the substrate includes forming the stack of MTJ layers on the curved top surface of the bottom electrode.

20. The method of claim 19, wherein the at least one layer of the stack of MTJ layers is conformally formed on the curved top surface of the bottom electrode such that the at least one layer of the stack of MTJ layers acquires a respective curved top surface.

* * * * *